United States Patent
Kinoshita et al.

(10) Patent No.: US 11,807,528 B2
(45) Date of Patent: Nov. 7, 2023

(54) SILICON-CONTAINING ALUMINUM NITRIDE PARTICLES, METHOD FOR PRODUCING SAME, AND LIGHT EMITTING DEVICE

(71) Applicant: NICHIA CORPORATION, Anan (JP)

(72) Inventors: Shimpei Kinoshita, Anan (JP); Shoji Hosokawa, Tokushima (JP)

(73) Assignee: NICHIA CORPORATION, Anan (JP)

(*) Notice: Subject to any disclaimer, the term of this patent is extended or adjusted under 35 U.S.C. 154(b) by 965 days.

(21) Appl. No.: 16/718,730

(22) Filed: Dec. 18, 2019

(65) Prior Publication Data
US 2020/0198968 A1    Jun. 25, 2020

(30) Foreign Application Priority Data

Dec. 20, 2018  (JP) .................... 2018-238755
Nov. 29, 2019  (JP) .................... 2019-216943

(51) Int. Cl.
*C01B 21/072*    (2006.01)
*H01L 23/00*     (2006.01)

(52) U.S. Cl.
CPC ............ *C01B 21/072* (2013.01); *H01L 24/01* (2013.01); *C01P 2002/74* (2013.01); *C01P 2004/64* (2013.01)

(58) Field of Classification Search
None
See application file for complete search history.

(56) References Cited

U.S. PATENT DOCUMENTS

| | | |
|---|---|---|
| 7,876,053 B2 | 1/2011 | Yamamoto et al. |
| 7,973,481 B2 | 7/2011 | Yamamoto et al. |
| 2002/0055021 A1 | 5/2002 | Niwa |
| 2003/0054147 A1 | 3/2003 | Niwa |
| 2004/0142153 A1 | 7/2004 | Niwa |
| 2008/0269040 A1 | 10/2008 | Sugawara et al. |
| 2008/0284309 A1 | 11/2008 | Yamamoto et al. |
| 2010/0259160 A1 | 10/2010 | Yamamoto et al. |

FOREIGN PATENT DOCUMENTS

| | | |
|---|---|---|
| JP | H0867567 A | 3/1996 |
| JP | 2001199769 A | 7/2001 |
| JP | 2011162431 A | 8/2011 |
| JP | 2012025660 A | 2/2012 |
| JP | 2012064928 A | 3/2012 |
| WO | 2005123627 A1 | 12/2005 |
| WO | 2007034955 A1 | 3/2007 |

OTHER PUBLICATIONS

Sekiguchi et al.; Influence of Si on the Particle Growth of AlN Ceramics; Applied Physics Express 7, 115503-1 to 115503-3; 2014.*
Cho et al.; Defects and Luminescence Control of AlN Ceramic by Si-Doping; Scripta Materialia; 109-112; 2014.*

* cited by examiner

*Primary Examiner* — Guinever S Gregorio
(74) *Attorney, Agent, or Firm* — HUNTON ANDREWS KURTH LLP

(57) ABSTRACT

Provided are silicon-containing aluminum nitride particles having a high reflectance, a method for producing the same, and a light emitting device. In certain embodiment, silicon-containing aluminum nitride particles having a total amount of aluminum and nitrogen of 90% by mass or more, a content of silicon in a range of 1.5% by mass or more and 4.0% by mass or less, and a content of oxygen in a range of 0.5% by mass or more and 2.0% by mass or less, and having an average reflectance in a wavelength range of 380 nm or more and 730 nm or less of 85% or more.

7 Claims, 7 Drawing Sheets

SILICON-CONTAINING ALUMINUM NITRIDE PARTICLES, METHOD FOR PRODUCING SAME, AND LIGHT EMITTING DEVICE

CROSS-REFERENCE TO RELATED PATENT APPLICATION

This application claims priority to Japanese Patent Application No. 2018-238755, filed on Dec. 20, 2018, and Japanese Patent Application No. 2019-216943, filed on Nov. 29, 2019, the entire disclosures of which are incorporated herein by references in their entirety.

BACKGROUND

Technical Field

The present disclosure relates to silicon-containing aluminum nitride particles, a method for producing the same, and a light emitting device.

Description of Related Art

Light emitting devices have been developed that emit light in white color, bulb color, orange color through combination of a light emitting element and a fluorescent material. The formation of the light emitting device is achieved by using a die bonding material that fixes the light emitting element to a support or a lead electrode, an under fill material that is disposed between the light emitting element and a supporting substrate or a lead electrode in flip chip mounting, a packaging material that fixes and retains the light emitting element and functions as a reflector. As a material for constituting the members of the light emitting device, such as the die bonding material, the under fill material, and the packaging material, a resin material containing a filler and so on has been used.

Japanese Unexamined Patent Publication No. 2012-64928 describes a resin material for a molded article to be a support of a semiconductor light emitting element, and the resin material contains a polyorganosiloxane, boron nitride or aluminum nitride having a primary particle diameter of 0.1 μm or more and 7.0 μm or less, and a curing catalyst.

The member constituting the light emitting device is demanded to have a high thermal conductivity for radiating heat from the light emitting element. The filler that also functions as a reflector contained in the packaging material is demanded to have a high reflectance.

Aluminum nitride contained in the resin material for a molded article described, for example, in Japanese Unexamined Patent Publication No. 2012-64928, has been known to have a higher thermal conductivity than oxides, such as aluminum oxide.

SUMMARY

However, aluminum nitride has a lower reflectance than oxides, such as aluminum oxide, in the visible region with a wavelength range of 380 nm or more and 730 nm or less.

Under the circumstances, an embodiment of the present disclosure provides silicon-containing aluminum nitride particles having a high reflectance, a method for producing the same, and a light emitting device.

The present disclosure encompasses the following embodiments.

A first embodiment of the present disclosure relates to silicon-containing aluminum nitride particles having a total amount of aluminum and nitrogen of 90% by mass or more, a content of silicon in a range of 1.5% by mass or more and 4.0% by mass or less, and a content of oxygen in a range of 0.5% by mass or more and 2.0% by mass or less, and having an average reflectance in a wavelength range of 380 nm or more and 730 nm or less of 85% or more.

A second embodiment of the present disclosure relates to a light emitting device including a light source and a support having the light source disposed thereon, the support containing the aforementioned silicon-containing aluminum nitride particles.

A third embodiment of the present disclosure relates to a light emitting device including a light source and a support having the light source disposed thereon, the light source and the support being bonded to each other with a member containing the aforementioned silicon-containing aluminum nitride particles.

A fourth embodiment of the present disclosure relates to a method for producing silicon-containing aluminum nitride particles, including:

providing a raw material mixture containing aluminum nitride and silicon nitride, wherein an amount of the silicon nitride is in a range of 2% by mass or more and 10% by mass or less based on a total amount of the aluminum nitride and the silicon nitride in the raw material mixture as 100% by mass; and subjecting the raw material mixture to a heat treatment at a pressure of 0.101 MPa or more and a temperature in a range of 1,700° C. or more and 2,100° C. or less.

According to the aforementioned embodiments, silicon-containing aluminum nitride particles having a high reflectance, a method for producing the same, and a light emitting device can be provided.

DETAILED DESCRIPTION

Figure 1:
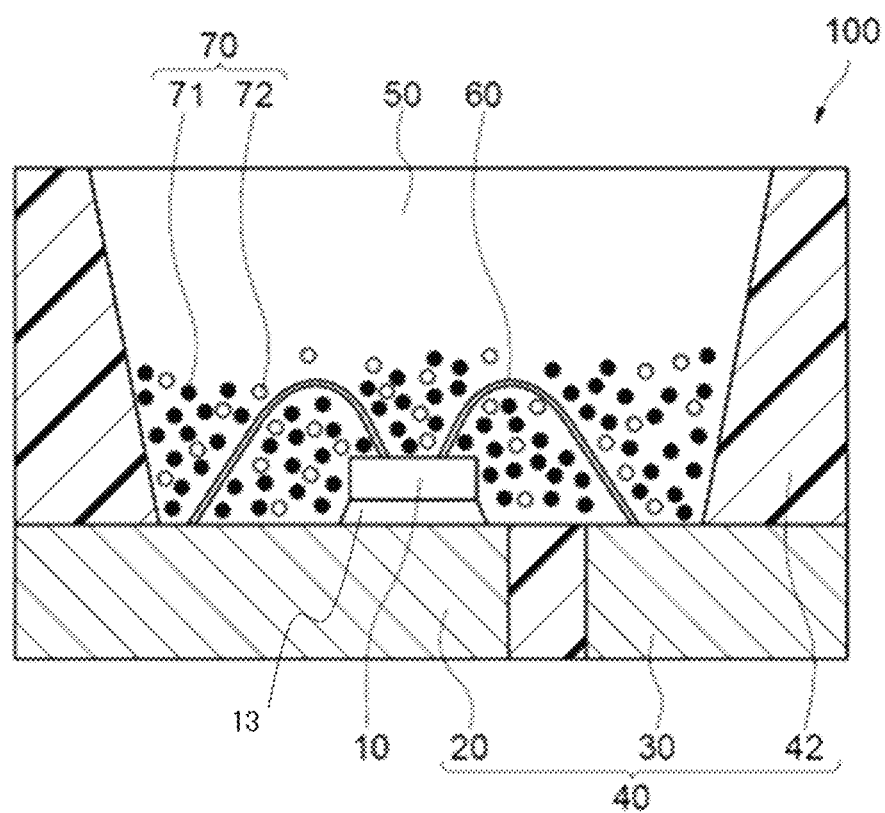
FIG. 1 is a schematic cross sectional view showing an example of a light emitting device.

The silicon-containing aluminum nitride particles, the method for producing the same, and the light emitting device according to the present disclosure will be described with reference to embodiments below. However, the embodiments shown below are examples for substantiating the technical concept of the present invention, and the present invention is not limited to the silicon-containing aluminum nitride particles, the method for producing the same, and the light emitting device shown below. The relationships between the color names and the color coordinates, the relationships between the wavelength ranges of light and the color names of monochromatic light, and the like are in accordance with JIS Z8110.

Silicon-Containing Aluminum Nitride Particles

The silicon-containing aluminum nitride particles have a total amount of aluminum and nitrogen of 90% by mass or more, a content of silicon in a range of 1.5% by mass or more and 4.0% by mass or less, and a content of oxygen in a range of 0.5% by mass or more and 2.0% by mass or less, and have an average reflectance in a wavelength range of 380 nm or more and 730 nm or less of 85% or more.

The silicon-containing aluminum nitride particles have a total amount of aluminum and nitrogen of 90% by mass or more and a content of silicon in a range of 1.5% by mass or more and 4.0% by mass or less, in which a part of aluminum in the crystal structure of aluminum nitride is replaced by silicon while retaining the crystal structure of aluminum nitride, so as to achieve a high average reflectance in a wavelength range of 380 nm or more and 730 nm or less of 85% or more. Aluminum nitride particles generally have a high thermal conductivity at 20° C. of from 150 W/m·K to 200 W/m·K. On the other hand, aluminum nitride generally has a low reflectance in the wavelength range of the visible region of approximately from 70% to 80%. The silicon-containing aluminum nitride particles may have an increased reflectance in a wavelength range of 380 nm or more and 730 nm or less (which may be hereinafter referred to as the "wavelength range of the visible region") while retaining the high thermal conductivity of the aluminum nitride particles, by replacing a part of aluminum in the crystal structure of aluminum nitride by silicon while retaining the crystal structure of aluminum nitride. The average reflectance in the wavelength range of the visible region of the silicon-containing aluminum nitride particles is preferably 89% or more, more preferably 90% or more, and further preferably 90.5% or more.

The average reflectance in the wavelength range of the visible region means the average value of the reflectance to light having particular wavelengths in a wavelength range of 380 nm or more and 730 nm or less.

The silicon-containing aluminum nitride particles have a content of oxygen in a range of 0.5% by mass or more and 2.0% by mass or less. The content of oxygen of the silicon-containing aluminum nitride particles is preferably in a range of 0.8% by mass or more and 1.8% by mass or less, and more preferably in a range of 0.9% by mass or more and 1.5% by mass or less. In the case where the silicon-containing aluminum nitride particles contain oxygen, it is estimated that hydroxy groups (OH groups) are attached to the surface of the silicon-containing aluminum nitride particles. In the case where the oxygen content of the silicon-containing aluminum nitride particles is in a range of 0.5% by mass or more and 2.0% by mass or less, it is estimated that hydroxy groups are attached to the surface of the silicon-containing aluminum nitride particles, and the hydroxy groups enhance the affinity to a resin and an organic solvent. In the case where the oxygen content of the silicon-containing aluminum nitride particles is in a range of 0.5% by mass or more and 2.0% by mass or less, the hydroxy groups existing on the surface of the particles enhance the dispersibility of the silicon-containing aluminum nitride particles, for example, in a resin composition constituting a member of a light emitting device.

The silicon-containing aluminum nitride particles preferably have a composition represented by $Al_{1-x}Si_xN$ (wherein x represents a number satisfying $0.02 \leq x \leq 0.08$) and preferably contain oxygen. In the case where the silicon-containing aluminum nitride particles have a composition represented by $Al_{1-x}Si_xN$ (wherein x satisfies $0.02 \leq x \leq 0.08$), a part of aluminum in the crystal structure of aluminum nitride is replaced by silicon while retaining the crystal structure of aluminum nitride, and therefore the average reflectance in the wavelength range of the visible region can be enhanced to 85% or more while retaining the high thermal conductivity of aluminum nitride. The parameter x in the composition represented by $Al_{1-x}Si_xN$ shows the molar ratio of Si in 1 mol of the composition. The parameter x is more preferably a number in a range of 0.03 or more and 0.07 or less ($0.03 \leq x \leq 0.07$), and further preferably a number in a range of 0.04 or more and 0.06 or less ($0.04 \leq x \leq 0.06$).

The silicon-containing aluminum nitride particles preferably have an average particle diameter measured by the Fisher sub-sieve sizer method (which may be hereinafter referred to as the FSSS method) in a range of 0.5 μm or more and 3.0 μm or less. In the case where the average particle diameter of the silicon-containing aluminum nitride particles is in a range of 0.5 μm or more and 3.0 μm or less, the particles may have good dispersibility in a resin composition for forming a member constituting a light emitting device, and the member of the light emitting device can be formed to have a target thickness. Furthermore, in the case where the average particle diameter is in a range of 0.5 μm or more and 3.0 μm or less in the process of producing a light emitting device, the silicon-containing aluminum nitride particles can be conveniently handled. The average particle diameter of the silicon-containing aluminum nitride particles is more preferably in a range of 1.0 μm or more and 2.5 μm or less, and may be 2.0 μm or less.

The silicon-containing aluminum nitride particles preferably have a powder X-ray diffraction pattern measured with a CuKα line (1.5418 Å), in which the peak intensity at a diffraction angle 2θ of 20.6±0.5° is 3% or less with respect to the peak intensity at a diffraction angle 2θ of 33.2±0.5° as 100%. The peak appearing at a diffraction angle 2θ of 33.2±0.5° in the powder X-ray diffraction pattern is a peak derived from the crystal structure of aluminum nitride (AlN), and the peak appearing at a diffraction angle 2θ of 20.6±0.5° therein is a peak derived from the crystal structure of silicon nitride ($Si_3N_4$). In the powder X-ray diffraction pattern of the silicon-containing aluminum nitride particles, in the case where the peak intensity at a diffraction angle 2θ of 20.6±0.5° is 3% or less with respect to the peak intensity at a diffraction angle 2θ of 33.2±0.5° as 100%, it can be confirmed that the crystal structure of aluminum nitride may be retained even though a part of aluminum is replaced by silicon. In the powder X-ray diffraction pattern of the silicon-containing aluminum nitride particles, the peak intensity at a diffraction angle 2θ of 20.6±0.5° is more preferably 2.5% or less, and further preferably 2% or less, may be 1.5% or less, may be 0.1% or more, and may be 0.2% or more, with respect to the peak intensity at a diffraction angle 2θ of 33.2±0.5° as 100%.

Light Emitting Device

A light emitting device using the silicon-containing aluminum nitride particles will be described. The light emitting device includes a light source and a support having the light source disposed thereon, and the support contains the silicon-containing aluminum nitride particles.

The light emitting device includes a light source and a support having the light source disposed thereon, and the light source and the support are bonded to each other with a member containing the silicon-containing aluminum nitride particles.

An example of the light emitting device will be described with reference to the drawing. FIG. 1 is a schematic cross sectional view showing an example of the light emitting device.

A light emitting device 100 has a molded article 40 as a support having a concave portion, a light emitting element 10 as a light source, and a fluorescent member 50 covering the light emitting element 10. The molded article 40 has a first lead 20, a second lead 30, and a resin portion 42 containing a thermoplastic resin or a thermosetting resin, which are integrally molded. The molded article 40 includes the first lead 20 and the second lead 30 constituting the bottom surface of the concave portion, and the resin portion 42 constituting the side surface of the concave portion. The side surface of the concave portion constituted by the resin portion 42 also functions as a reflector of the light emitting device. The light emitting element 10 is die-bonded to the upper surface of the first lead 20 forming the bottom of the concave portion of the molded article 40 with a bonding member 13. The light emitting element 10 has a pair of positive and negative electrodes, and the pair of positive and negative electrodes are electrically connected to the first lead 20 and the second lead 30 respectively with wires 60. The light emitting element 10 is covered with the fluorescent member 50. The fluorescent member 50 contains a fluorescent material 70 performing wavelength conversion of the light emitted from the light emitting element 10. The fluorescent material 70 may contain a first fluorescent material 71 and a second fluorescent material 72, which have light emission wavelengths in different wavelength ranges.

The silicon-containing aluminum nitride particles may be preferably contained in the resin portion 42 constituting the molded article 40 as a support. The silicon-containing aluminum nitride particles have a high thermal conductivity of aluminum nitride and a high reflectance in the wavelength range of the visible region of 85% or more, and therefore the silicon-containing aluminum nitride particles contained in the resin portion 42 constituting the molded article 40 having a concave portion functioning as a reflector can enhance the extraction efficiency of light.

The silicon-containing aluminum nitride particles may be preferably contained in the bonding member 13 for die-bonding the light emitting element 10 to the first lead 20. In the case where the silicon-containing aluminum nitride particles are contained in the bonding member 13 for adhering the light emitting element 10 to the first lead 20, heat from the light emitting element 10 can be radiated through the bonding member 13, which includes the silicon-containing aluminum nitride particles with high thermal conductivity, from the first lead 20 toward the outside or toward a radiator member disposed in contact with the first lead 20, and thereby the heat radiation capability of the light emitting device can be enhanced.

The content of the silicon-containing aluminum nitride particles contained in the members constituting the light emitting device may vary depending on the members. For example, the content of the silicon-containing aluminum nitride particles in the resin portion 42 may be in a range of 100 parts by mass or more and 300 parts by mass or less per 100 parts by mass of the resin constituting the resin portion 42. The content of the silicon-containing aluminum nitride particles in the bonding member for adhering the light emitting element 10 may be in a range of 10 parts by mass or more and 100 parts by mass or less per 100 parts by mass in total of the resin and the conductive material constituting the bonding member 13.

Light Emitting Element

A light emitting element may be used as a light source. The light emitting element preferably has a light emission peak wavelength in a range of 380 nm or more and 500 nm or less, and more preferably in a range of 380 nm or more and 485 nm or less, for providing light with the target color tone.

The light emission spectrum of the light emitting element may have a full width at half maximum of 30 nm or less. The full width at half maximum means the wavelength width of the light emission spectrum at 50% of the maximum light emission intensity in the light emission spectrum. The light emitting element used is preferably a semiconductor light emitting element. The use of the semiconductor light emitting element as the light source can provide a light emitting device that has high efficiency, high linearity of output with respect to input, and high stability against mechanical impacts. Examples of the semiconductor light emitting element used include a semiconductor light emitting element using a nitride semiconductor ($In_XAl_YGa_{1-X-Y}N$, wherein $0 \leq X$, $0 \leq Y$, and $X+Y \leq 1$).

Method for Producing Silicon-containing Aluminum Nitride Particles

The method for producing silicon-containing aluminum nitride particles includes: providing a raw material mixture containing aluminum nitride and silicon nitride, wherein an amount of the silicon nitride is in a range of 2% by mass or more and 10% by mass or less based on a total amount of the aluminum nitride and the silicon nitride in the raw material mixture as 100% by mass; and subjecting the raw material mixture to a heat treatment at a pressure of 0.101 MPa or more and a temperature in a range of 1,700° C. or more and 2,100° C. or less.

Raw Material Mixture

In the raw material mixture, the content of the silicon nitride is preferably in a range of 3% by mass or more and 9% by mass or less, and more preferably in a range of 4% by mass or more and 8% by mass or less, based on the total amount of the aluminum nitride and the silicon nitride as 100% by mass. In the case where the raw material mixture contains silicon nitride in an amount in a range of 2% by mass or more and 10% by mass or less based on the total amount of aluminum nitride and silicon nitride as 100% by mass, a part of aluminum in the crystal structure of aluminum nitride is replaced by silicon while retaining the crystal structure of aluminum nitride, and thereby the resulting silicon-containing aluminum nitride particles can have a high average reflectance in the wavelength range of the visible region of 85% or more. In the case where the raw material mixture is measured for the X-ray diffraction (XRD) spectrum with a powder X-ray diffraction device, the X-ray diffraction pattern of the raw material mixture has both the peak derived from the crystal structure of aluminum nitride and the peak derived from the crystal structure of silicon nitride appearing therein.

The mixing of aluminum nitride and silicon nitride is preferably performed by using a mixer. The mixer used may be a ball mill, which has been ordinarily used industrially, and may also be a pulverizer, such as a vibration mill, a roll mill, and a jet mill. For controlling the specific surface areas of the particles of aluminum nitride and silicon nitride used to a certain range, aluminum nitride and silicon nitride may be classified by using a wet separator, such as a sedimentation tank, a hydrocyclone, and a centrifugal separator, or a dry classifier, such as a cyclone and an air separator, which have been ordinarily used industrially.

Heat Treatment

The resulting raw material mixture is subjected to a heat treatment at a pressure of 0.101 MPa or more and a temperature in a range of 1,700° C. or more and 2,100° C. or less. It is estimated that the heat treatment replaces a part of aluminum in the crystal structure of aluminum nitride by silicon while retaining the crystal structure of aluminum nitride. The X-ray diffraction pattern of the silicon-containing aluminum nitride particles after the heat treatment measured with a powder X-ray diffraction device has the peak derived from the crystal structure of aluminum nitride appearing therein, but the peak derived from the crystal structure of silicon nitride does not appear therein, or even though appears, is a significantly small peak having a peak intensity of 3% or less with respect to the peak intensity derived from the crystal structure of aluminum nitride as 100%.

The raw material mixture is subjected to the heat treatment at a pressure of 0.101 MPa or more, and preferably a pressure in a range of more than 0.101 MPa and 1 MPa or less. In the case where the raw material mixture is subjected to the heat treatment at a pressure of 0.101 MPa or more, the crystal structure of aluminum nitride is prevented from being broken even though a part of aluminum in the crystal structure of aluminum nitride is replaced by silicon, and thereby the crystal structure of aluminum nitride having a high thermal conductivity can be retained.

The temperature of the heat treatment is preferably in a range of 1,700° C. or more and 2,100° C. or less, and more preferably in a range of 1,750° C. or more and 2,050° C. or less. In the case where the temperature of the heat treatment is in a range of 1,700° C. or more and 2,100° C. or less, a part of aluminum in the crystal structure of aluminum nitride is replaced by silicon while retaining the crystal structure of aluminum nitride, and therefore the silicon-containing aluminum nitride particles having a high average reflectance in the wavelength range of the visible region can be provided while retaining the high thermal conductivity of aluminum nitride.

The atmosphere of the heat treatment is preferably a nitrogen atmosphere. It suffices that the atmosphere of the heat treatment has a content of nitrogen gas of 80% by volume or more in the atmosphere, and the content of nitrogen gas in the atmosphere is preferably 90% by volume or more, more preferably 95% by volume or more, further preferably 98% by volume or more, and most preferably 100% by volume. The atmosphere of the heat treatment may contain oxygen in an amount of 15% by volume or less, but in the case where oxygen is contained, aluminum may be oxidized to alter the crystal structure, and it may be difficult to retain the high thermal conductivity. With a smaller content of oxygen gas in the atmosphere, the silicon-containing aluminum nitride particles having a high reflectance can be obtained while retaining the high thermal conductivity thereof. The content of oxygen gas in the atmosphere of the heat treatment is preferably 10% by volume or less, more preferably 5% by volume or less, and further preferably 1% by volume or less.

The period of time of the heat treatment, specifically the retention time of the raw material mixture at the temperature of the heat treatment, is preferably in a range of 1 hour or more and 10 hours or less, and more preferably in a range of 2 hours or more and 8 hours or less. In the case where the retention time of the raw material mixture at the temperature of the heat treatment is in a range of 1 hour or more and 10 hours or less, a part of aluminum in the crystal structure of aluminum nitride can be replaced by silicon while retaining the crystal structure of aluminum nitride, and thereby the silicon-containing aluminum nitride particles having a high reflectance in the wavelength range of the visible region can be obtained while retaining the high thermal conductivity of aluminum nitride.

Classification Treatment

The resulting silicon-containing aluminum nitride particles may be further subjected to a classification treatment. As the classification treatment, it is to perform at least one of wet dispersion, wet sieving, dehydration, drying, and dry sieving.

EXAMPLES

The present disclosure will be described more specifically with reference to examples below. The present disclosure is not limited to the examples.

Example 1

94.5% by mass of aluminum nitride powder and 5.5% by mass of silicon nitride powder with respect to the total amount of the aluminum nitride powder and the silicon nitride powder as 100% by mass were mixed to provide a raw material mixture. The raw material mixture was charged in a vessel formed of boron nitride. The raw material mixture charged in the vessel was subjected to a heat treatment in a nitrogen atmosphere having a nitrogen gas content of 100% by volume at a pressure of 0.92 MPa and a temperature of 1,800° C. for 4 hours. The heat-treated product was subjected to a classification treatment including wet dispersion, wet sieving, dehydration, drying, and dry sieving, so as to produce silicon-containing aluminum nitride particles. Table 1 shows the mixing proportions of the aluminum nitride powder and the silicon nitride powder in the raw material mixtures and the heat treatment temperature in Examples and Comparative Examples.

Example 2

Silicon-containing aluminum nitride particles were produced in the same manner as in Example 1 except that the temperature of the heat treatment was changed to 2,030° C.

Comparative Example 1

Silicon-containing aluminum nitride particles were produced in the same manner as in Example 1 except that 98.5% by mass of aluminum nitride powder and 1.5% by mass of silicon nitride powder with respect to the total amount of the aluminum nitride powder and the silicon nitride powder as 100% by mass were mixed to provide a raw material mixture, and the resulting raw material mixture was used.

Comparative Example 2

Silicon-containing aluminum nitride particles were produced in the same manner as in Example 1 except that 89.3% by mass of aluminum nitride powder and 10.7% by mass of silicon nitride powder with respect to the total amount of the aluminum nitride powder and the silicon nitride powder as 100% by mass were mixed to provide a raw material mixture, and the resulting raw material mixture was used.

TABLE 1

|  | Aluminum nitride (% by mass) | Silicon nitride (% by mass) | Heat treatment temperature (° C.) |
|---|---|---|---|
| Example 1 | 94.5 | 5.5 | 1800 |
| Example 2 | 94.5 | 5.5 | 2030 |
| Comparative Example 1 | 98.5 | 1.5 | 1800 |
| Comparative Example 2 | 89.3 | 10.7 | 1800 |

Evaluation
Reflection Spectrum

Figure 2:
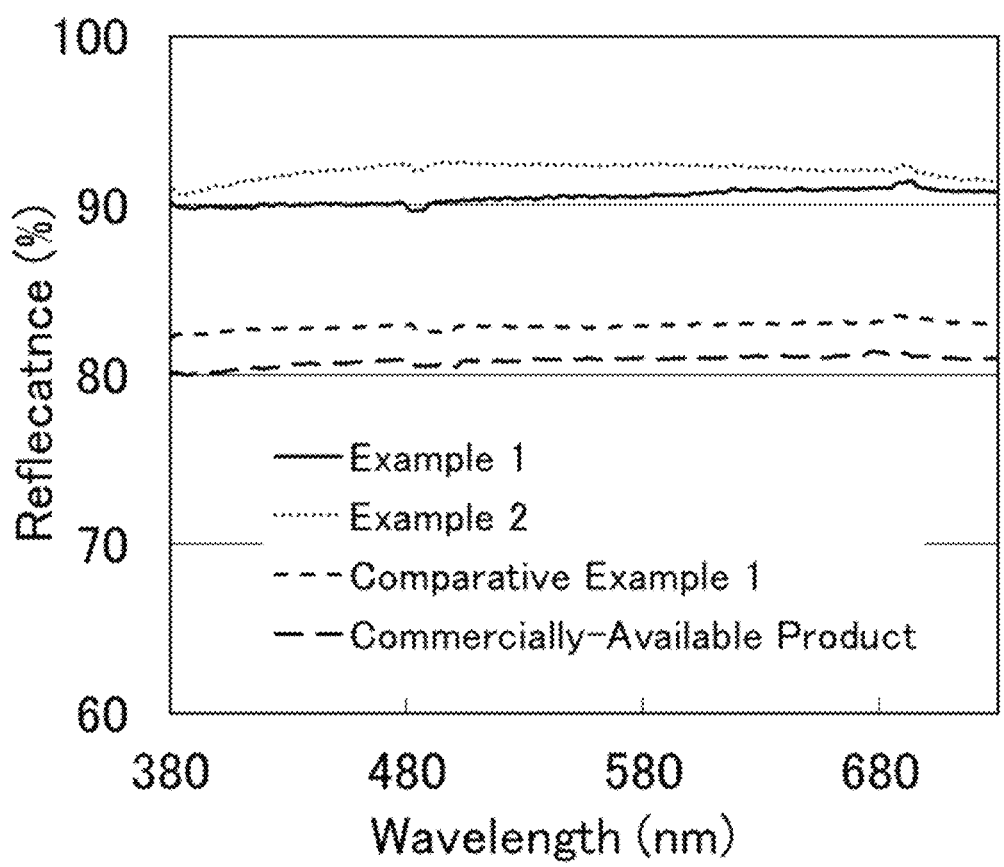
FIG. 2 shows the reflection spectra of the silicon-containing aluminum nitride particles of Examples 1 and 2 and Comparative Example 1, and the commercially available aluminum nitride.

For the resulting silicon-containing aluminum nitride particles of Examples and Comparative Examples and aluminum nitride (commercially available product), a specimen thereof was irradiated with light from a halogen lamp as an excitation light source at room temperature (25° C.±5° C.) with a spectrofluorophotometer (F-4500, a product name, produced by Hitachi High-Technologies Corporation), and scanned while matching the wavelengths of the spectrofluorophotometer on the excitation side and the fluorescent side, so as to measure the reflection spectrum in a wavelength range of 380 nm or more and 730 nm or less. The reflectance of the silicon-containing aluminum nitride particles was obtained in terms of relative reflectance based on the reflectance of calcium hydrogen phosphate ($CaHPO_4$) used as the standard specimen to excitation light having an excitation wavelength of 450 nm. The results are shown in FIG. 2. The reflectances of the silicon-containing aluminum nitride particles of Examples and Comparative Examples at 380 nm and 730 nm are shown in Table 2. The commercially available aluminum nitride particles have an average particle diameter of from 0.96 μm to 1.07 μm (catalogue value) and a thermal conductivity at 20° C. of from 180 W/m·K to 200 W/m·K (catalogue value).

Average Particle Diameter

The resulting silicon-containing aluminum nitride particles of Examples and Comparative Examples was measured for the average particle diameter with Fisher Sub-Sieve Sizer Model 95 (produced by Fisher Scientific, Inc.). Specifically, 1 cm³ of a specimen was weighed and packed in a dedicated tubular vessel, to which dry air was then fed at a constant pressure, and the average particle diameter was obtained by the FSSS method from the relational expression of the pressure of the permeated air and the porosity of the specimen. The results are shown in Table 2. The average particle diameter measured by the FSSS method may also be referred to as a Fisher sub-sieve sizer's number.

X-Ray Diffraction Pattern and Peak Intensity

Figure 3:
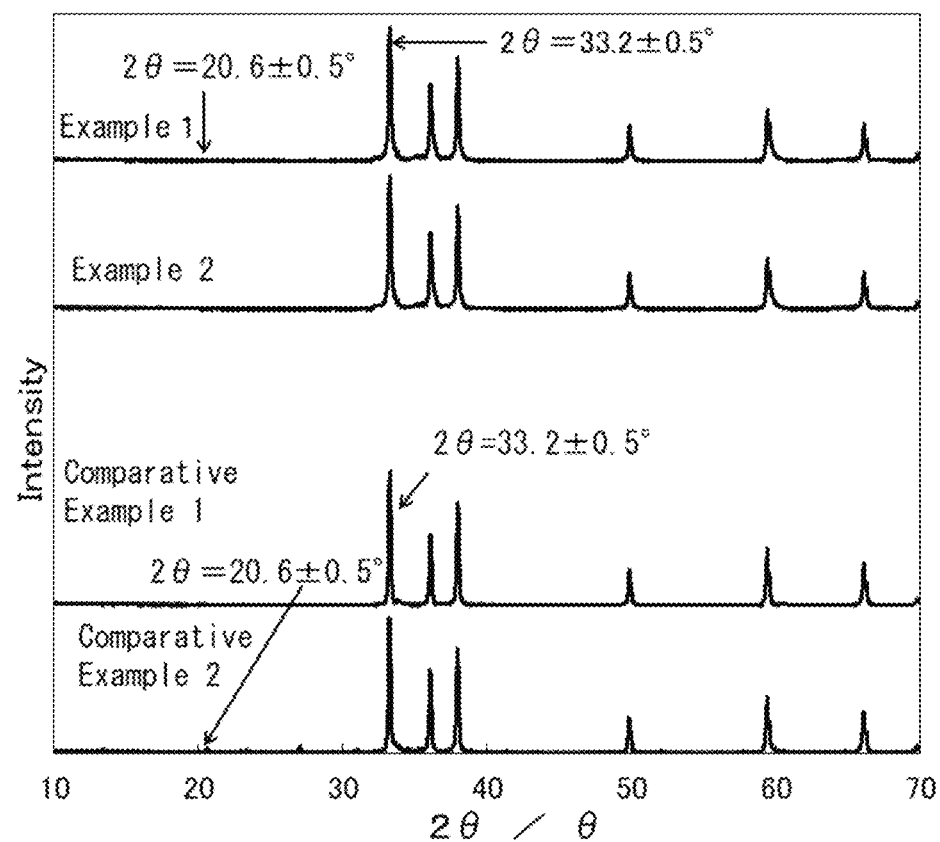
FIG. 3 shows the X-ray diffraction patterns of the silicon-containing aluminum nitride particles of Examples 1 and 2 and Comparative Examples 1 and 2.
Figure 4:
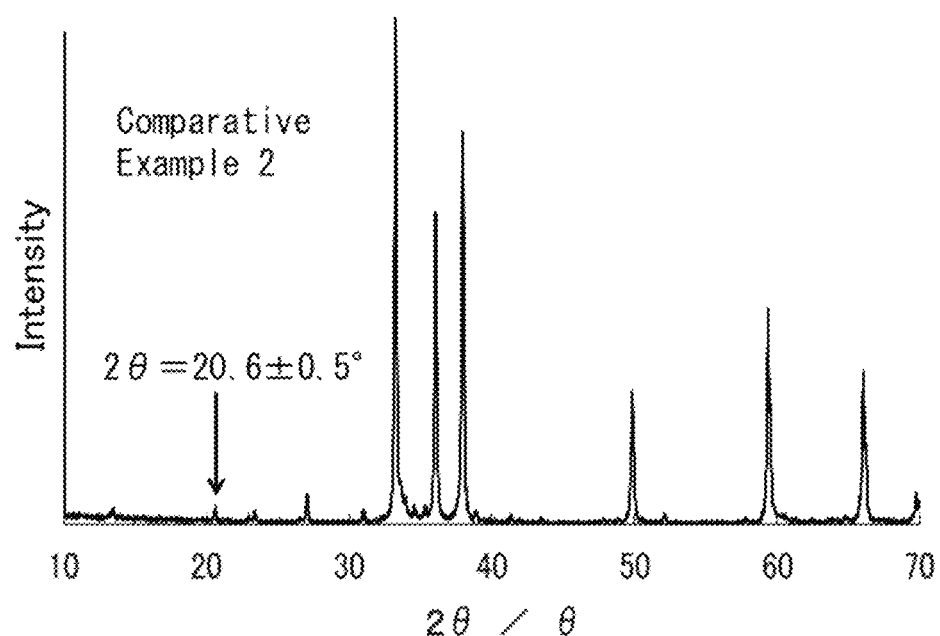
FIG. 4 is an enlarged view of the X-ray diffraction pattern of the silicon-containing aluminum nitride particles of Comparative Example 2.
Figure 5:
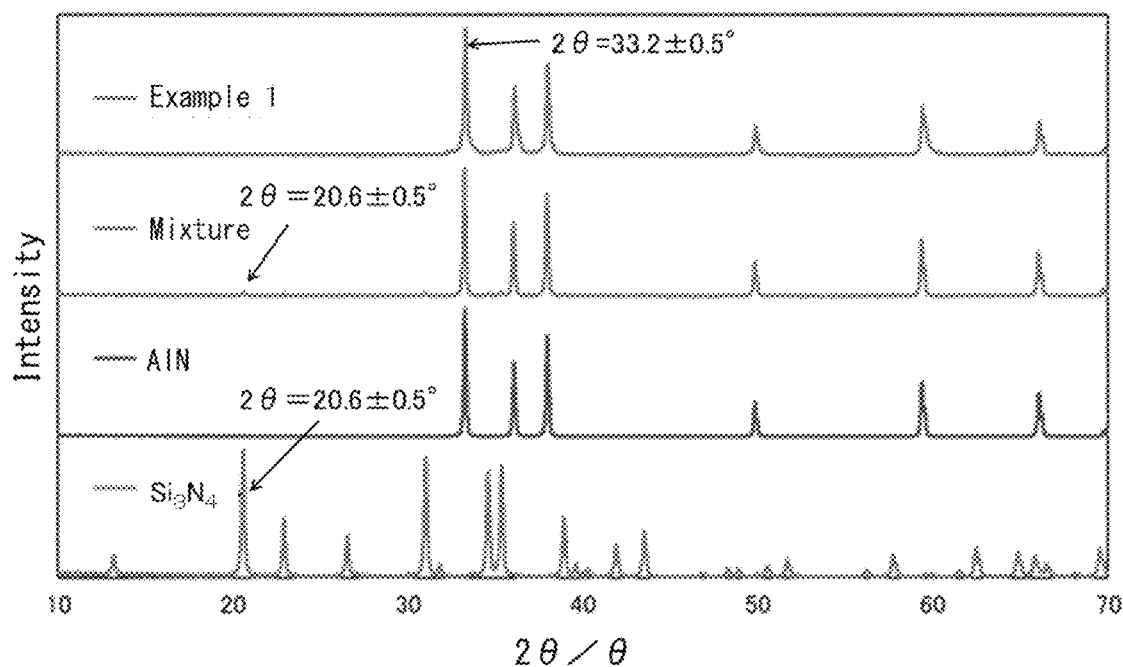
FIG. 5 shows the X-ray diffraction patterns of the silicon-containing aluminum nitride particles of Example 1 and the mixed powder of aluminum nitride and silicon nitride of Example 1, the commercially available aluminum nitride particles, and the commercially available silicon nitride particles.

The resulting silicon-containing aluminum nitride particles of Examples and Comparative Examples was measured for the X-ray diffraction pattern with a horizontal sample multipurpose X-ray diffraction system (Ultima IV, a product name, produced by Rigaku Corporation, X-ray source: CuKα line (λ=1.5418 Å, tube voltage: 40 kV, tube current: 40 mA)). FIG. 3 shows the X-ray diffraction patterns of the silicon-containing aluminum nitride particles of Examples 1 and 2 and Comparative Examples 1 and 2. FIG. 4 shows an enlarged view of the X-ray diffraction pattern of the silicon-containing aluminum nitride particle of Comparative Example 2. FIG. 5 shows the X-ray diffraction patterns of the silicon-containing aluminum nitride particles of Example 1, the raw material mixture of Example 1, the commercially available aluminum nitride (AlN) powder, and the commercially available silicon nitride ($Si_3N_4$) powder. In the X-ray diffraction patterns of the silicon-containing aluminum nitride particles of Examples and Comparative Examples, the peak intensity at a diffraction angle 2θ of 20.6±0.5° with respect to the peak intensity at a diffraction angle 2θ of 33.2±0.5° as 100% was obtained. The results are shown in Table 2. The commercially available aluminum nitride powder used herein was the aluminum nitride powder used for the measurement of the reflection spectrum. The commercially available silicon nitride powder has an average particle diameter of from 0.7 μm to 1.1 μm (catalogue value) and a thermal conductivity at 20° C. of from 27 W/m·K to 85 W/m·K (catalogue value).

TABLE 2

|  | Reflectance (%) | | Average particle diameter (μm) | Peak intensity (%) |
|---|---|---|---|---|
|  | 380 nm | 730 nm | | |
| Example 1 | 90.2 | 90.8 | 1.1 | 1.2 |
| Example 2 | 91.3 | 91.5 | 2.3 | 1.2 |
| Comparative Example 1 | 82.2 | 83.0 | 0.9 | 0.9 |
| Comparative Example 2 | 88.6 | 89.2 | 1.0 | 3.4 |

Compositional Analysis

The resulting silicon-containing aluminum nitride particles of Examples and Comparative Examples was subjected to compositional analysis. Al and Si of the silicon-containing aluminum nitride particles were quantitatively determined with an inductively coupled plasma atomic emission spectroscope (ICP-AES) (manufactured by Perkin Elmer, Inc.). O and N of the silicon-containing aluminum nitride particles were quantitatively determined with an oxygen-nitrogen analyzer (manufactured by Horiba, Ltd.). In 1 mol of the composition represented by $Al_{1-x}Si_xN$, the parameter x showing the molar ratio of Si was obtained with respect to the molar ratio of N of 1. The results are shown in Table 3.

TABLE 3

|  | Compositional analysis (% by mass) | | | | |
|---|---|---|---|---|---|
|  | Al | Si | N | O | Parameter x |
| Example 1 | 61.2 | 3.4 | 33.4 | 1.5 | 0.05 |
| Example 2 | 61.0 | 3.0 | 33.4 | 0.9 | 0.05 |
| Comparative Example 1 | 63.4 | 0.9 | 33.1 | 1.6 | 0.01 |
| Comparative Example 2 | 58.2 | 6.1 | 33.6 | 1.2 | 0.09 |

As shown in Table 2 and FIG. 2, the silicon-containing aluminum nitride particles of Examples 1 and 2 had a high average reflectance in a wavelength range of 380 nm or more and 730 nm or less of 90% or more. As shown in Table 3, the silicon-containing aluminum nitride particles of Examples 1 and 2 had a composition represented by $Al_{0.95}Si_{0.05}N$.

As shown in Table 2 and FIG. 3, the silicon-containing aluminum nitride particles of Examples 1 and 2 had a powder X-ray diffraction pattern, in which the peak intensity at a diffraction angle 2θ of 20.6±0.5° was as small as 1.2% with respect to the peak intensity at a diffraction angle 2θ of 33.2±0.5° as 100%, and since the peak at a diffraction angle 2θ of 20.6±0.5° derived from the crystal structure of silicon nitride was small, the crystal structure of aluminum nitride was retained, and the high thermal conductivity of aluminum nitride was retained.

As shown in Table 2 and FIG. 2, the silicon-containing aluminum nitride particles of Comparative Example 1 had a low average reflectance of less than 85%. As shown in Table 3, the silicon-containing aluminum nitride particles of Comparative Examples 1 had a composition represented by $Al_{0.99}Si_{0.01}N$.

As shown in Table 2, the silicon-containing aluminum nitride particles of Comparative Example 2 had a relatively high average reflectance, but as shown in FIG. 3 and the enlarged view thereof shown in FIG. 4, a peak at a diffraction angle 2θ of 20.6±0.5° derived from the crystal structure of silicon nitride appeared. As shown in Table 2, the silicon-containing aluminum nitride particles of Comparative Example 2 had a powder X-ray diffraction pattern, in which the peak intensity at a diffraction angle 2θ of 20.6±0.5° was as large as beyond 3% with respect to the peak intensity at a diffraction angle 2θ of 33.2±0.5° as 100%. As shown in Table 3, the silicon-containing aluminum nitride particles of Comparative Example 2 contained more than 4.0% by mass of silicon, and therefore it was estimated that the crystal structure of aluminum nitride was altered to fail to retain the high thermal conductivity of aluminum nitride. The silicon-containing aluminum nitride particles of Comparative Examples 2 had a composition represented by $Al_{0.91}Si_{0.09}N$.

As shown in FIG. 5, in the powder X-ray diffraction pattern of the silicon-containing aluminum nitride particles of Example 1, the peak at a diffraction angle 2θ of 20.6±0.5° derived from the crystal structure of silicon nitride was significantly small. It was estimated from the result that in silicon-containing aluminum nitride particles of Example 1 obtained through the heat treatment of the raw material mixture, a part of aluminum in the crystal structure of aluminum nitride was replaced by silicon while retaining the crystal structure of aluminum nitride.

In the powder X-ray diffraction pattern of the raw material mixture before the heat treatment of Example 1, a peak at a diffraction angle 2θ of 33.2±0.5° derived from the crystal structure of aluminum nitride appeared, and a peak at a diffraction angle 2θ of 20.6±0.5° derived from the crystal structure of silicon nitride also appeared. It was estimated from the result that the raw material mixture retained the crystal structure of aluminum nitride and the crystal structure of silicon nitride.

SEM Micrograph

Figure 6:
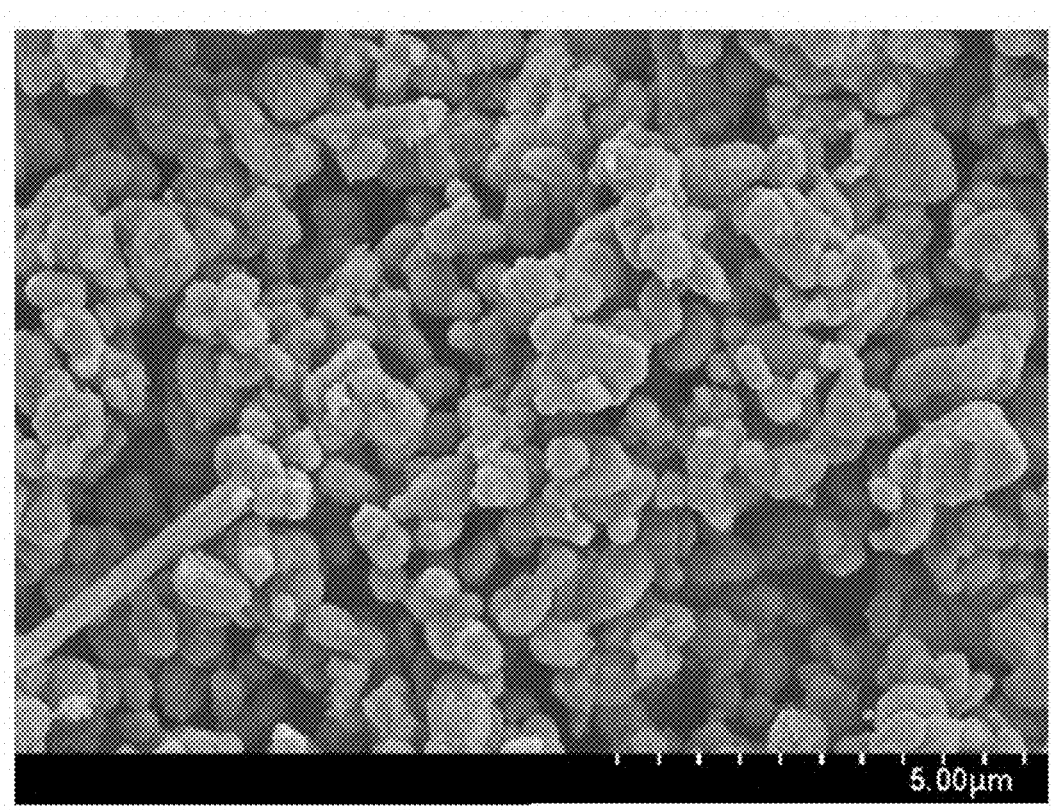
FIG. 6 is the SEM micrograph of the silicon-containing aluminum nitride particles of Example 1.

SEM micrographs of the silicon-containing aluminum nitride particles of Examples and Comparative Examples were obtained with a scanning electron microscope (SEM). FIG. 6 is the SEM micrograph of the silicon-containing aluminum nitride particles of Example 1, and FIG. 7 is the SEM micrograph of the silicon-containing aluminum nitride particles of Comparative Example 1.

Figure 7:
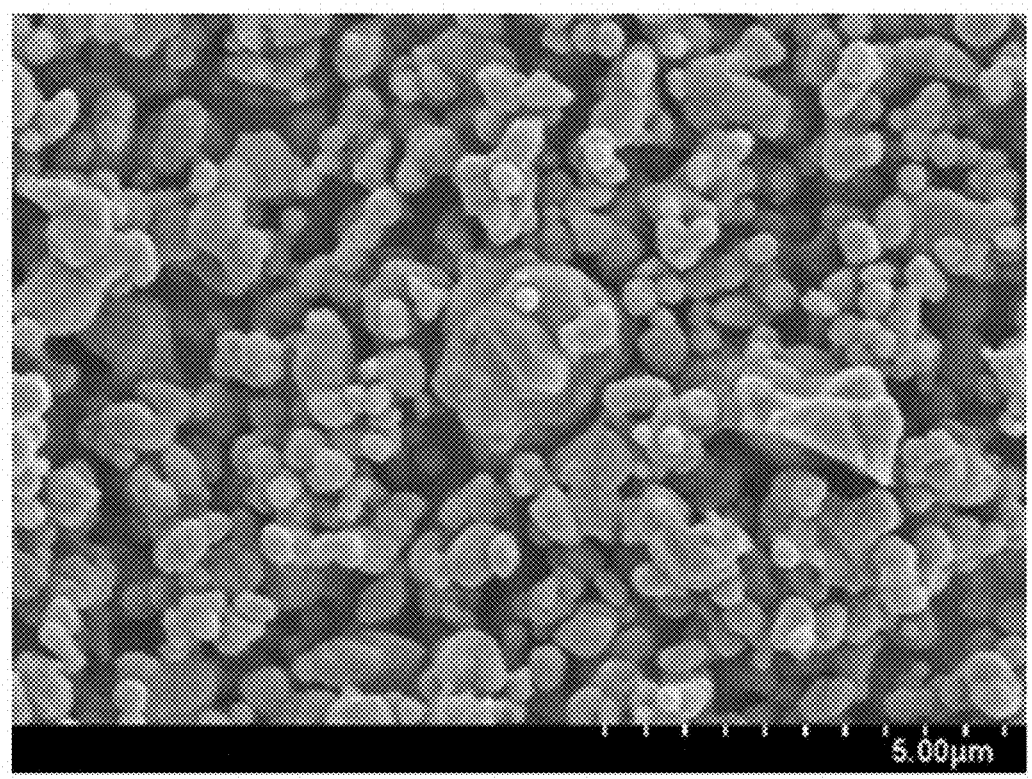
FIG. 7 is the SEM micrograph of the silicon-containing aluminum nitride particles of Comparative Example 1.

There was no significant difference in appearance between the silicon-containing aluminum nitride particles of Example 1 in the SEM micrograph shown in FIG. 6 and the silicon-containing aluminum nitride particles of Comparative Example 1 in the SEM micrograph shown in FIG. 7.

The silicon-containing aluminum nitride particles of the present disclosure can be favorably applied to a filler for a member, such as a support and a bonding member.

The invention claimed is:

1. Silicon-containing aluminum nitride particles having a total amount of aluminum and nitrogen of 90% by mass or more, a content of silicon in a range of 3.0% by mass or more and 4.0% by mass or less, and a content of oxygen in a range of 0.9% by mass or more and 2.0% by mass or less, and having an average reflectance in a wavelength range of 380 nm or more and 730 nm or less that is 90% or more.

2. The silicon-containing aluminum nitride particles according to claim 1, having a composition represented by $Al_{1-x}Si_xN$, wherein x satisfies $0.05 \leq x \leq 0.08$, and containing oxygen.

3. The silicon-containing aluminum nitride particles according to claim 1, having an average particle diameter measured by a Fisher sub-sieve sizer method in a range of 0.5 μm or more and 3.0 μm or less.

4. The silicon-containing aluminum nitride particles according to claim 1, having a powder X-ray diffraction pattern measured with a CuKα line (1.5418 Å) in which a peak intensity at a diffraction angle 2θ of 20.6±0.5° is 3% or less with respect to a peak intensity at a diffraction angle 2θ of 33.2±0.5° as 100%.

5. The silicon-containing aluminum nitride particles according to claim 1, having the average reflectance 90.5% or more.

6. A light emitting device comprising a light source and a support having the light source disposed thereon, the support comprising the silicon-containing aluminum nitride particles according to claim 1.

7. A light emitting device comprising a light source, a support having the light source disposed thereon and a bonding member bonding the light source and the support, wherein the bonding member comprises the silicon-containing aluminum nitride particles according to claim 1 and resin.

* * * * *